United States Patent [19]
Glasheen

[11] Patent Number: 5,261,015
[45] Date of Patent: Nov. 9, 1993

[54] MAGNETICALLY-ACTUATABLE OPTO-MECHANICAL ON/OFF SWITCH AND SYSTEMS FOR USE THEREWITH

[75] Inventor: William M. Glasheen, Derry, N.H.
[73] Assignee: Ametek, Inc., New York, N.Y.
[21] Appl. No.: 796,544
[22] Filed: Nov. 21, 1991
[51] Int. Cl.⁵ .............................................. G02B 6/26
[52] U.S. Cl. .............................................. 385/23; 385/57
[58] Field of Search ................. 385/14, 15, 16, 17, 385/18, 19, 20, 21, 22, 23, 57

[56] References Cited

U.S. PATENT DOCUMENTS

| | | | |
|---|---|---|---|
| 4,062,620 | 12/1977 | Pirolli | 385/57 |
| 4,146,856 | 3/1979 | Jaeschke | 385/23 |
| 4,318,587 | 3/1982 | Grassl | 385/23 |
| 4,337,995 | 7/1982 | Tanaka et al. | 385/25 |
| 4,418,980 | 12/1983 | Keil et al. | 385/1 |
| 4,452,507 | 6/1984 | Winzer | 385/21 |
| 4,491,792 | 1/1985 | Bullock et al. | 385/57 |
| 4,569,570 | 2/1986 | Brogardh et al. | 385/12 |
| 4,650,281 | 3/1987 | Jaeger et al. | 385/12 X |
| 4,709,977 | 12/1987 | Auracher | 385/41 |
| 4,796,966 | 1/1989 | Kovaleski et al. | 385/57 |
| 4,836,632 | 6/1989 | Bardoorian | 385/25 |
| 4,862,124 | 8/1989 | Rando | 385/16 |
| 4,887,877 | 12/1989 | Inoue et al. | 359/108 |
| 4,896,937 | 1/1990 | Kraetsch et al. | 385/16 |
| 4,932,743 | 6/1990 | Isobe et al. | 385/14 |
| 4,938,555 | 7/1990 | Savage | 385/18 |
| 4,945,527 | 7/1990 | Sunagawa | 369/44.11 |
| 4,991,926 | 2/1991 | Pavlath | 385/27 |
| 5,016,978 | 5/1991 | Fargette et al. | 385/19 |

OTHER PUBLICATIONS

Fiber and Integrated Optics, vol. 3, Nos. 2-3-Nov. 27, 1979 "Rigid Reed-Type Routing Switch for Multimode Optical Fiber" Stockmann et al.

Primary Examiner—Frank Gonzalez
Attorney, Agent, or Firm—Amster, Rothstein & Ebenstein

[57] ABSTRACT

A monolithically fabricated magnetically-actuatable opto-mechanical on/off switch includes a pair of planar optical waveguides, the first waveguide of the pair being fixed in position and the second waveguide of the pair being movable between a conducting orientation wherein it is in optical alignment with the one waveguide and a non-conducting orientation wherein it is not in optical alignment with the one waveguide. A ferromagnetic component is fixedly secured to the movable second waveguide for movement therewith as a unit. A magnet may be provided for moving the ferromagnetic component, and hence for moving the movable second waveguide between the conducting and non-conducting orientations.

18 Claims, 3 Drawing Sheets

MAGNETICALLY-ACTUATABLE OPTO-MECHANICAL ON/OFF SWITCH AND SYSTEMS FOR USE THEREWITH

BACKGROUND OF THE INVENTION

The present invention relates to an opto-mechanical on/off switch, and more particularly to such a switch which is monolithically fabricated and magnetically actuatable and to systems using such a switch.

The common electrical reed relay is an example of an electro-mechanical on/off switch which can be operated by an electromagnetic field so that it either conducts or does not conduct electricity. An opto-mechanical on/off switch is similar to an electrical reed relay but, depending on whether it is actuated or not, either enables or disables an optical transmission rather than an electrical transmission. The on/off switch may act as a single pole, single throw switch or as a modulator.

A magnetically-actuatable opto-mechanical on/off switch, like the common electrical reed relay, has a variety of different applications. For example, it may be used as a liquid level sensor operated by a float magnet for level detection, as a modulator to enable detection of very small optical signals by synchronous demodulation, as an optical pick-off in a flowmeter that uses magnetic energy to communicate the position of an internal flowmeter part to the optical pick-off, etc.

Currently available products use a mechanical approach to electrically control optical switches which is similar to that used for electrically controlled reed relays—that is, an electric coil moves a mechanical part which carries an input optical fiber to a position of transmission with respect to one or another output fibers. Such prior art electrically controlled optical switches are typically of substantial mass. Since such discrete optical switchers must typically be fabricated separately (i.e., one switch at a time), the switches, and particularly arrays of these switches, tend to be expensive to manufacture. Thus, the need remains for an economical optical switch which is of smaller mass than the usual prior art relay parts so that switching can be performed with significantly less energy and/or in significantly less time.

Accordingly, it is an object of the present invention to Provide a magnetically-actuatable opto-mechanical on/off switch.

Another object is to provide such a switch which is of smaller mass than comparable prior art optical switches so that switching can be performed with significantly less energy and/or in significantly less time.

A further object is to provide a system and device containing a plurality of such switches, optionally monolithically fabricated on a single substrate.

It is also an object of the present invention to provide such switches, systems and devices which are economical to manufacture and inexpensive to maintain.

SUMMARY OF THE INVENTION

The above and related objects of the present invention are obtained in a magnetically-actuatable opto-mechanical on/off switch. The switch comprises first and second optical waveguides mounted for relative movement between a first position wherein light is transmittable through the first and second waveguides and a second position wherein light is blocked from transmission through the first and second waveguides. A magnetic actuator effects relative movement of the first and second waveguides to control the transmission of light through the switch.

In a preferred embodiment, the switch comprises a pair of planar optical waveguides, the first waveguide of the pair being fixed in position and the second waveguide of the pair being movable between a conducting orientation wherein it is in optical alignment with the first fixed waveguide and a non-conducting orientation wherein it is not in optical alignment with the first fixed waveguide. A ferromagnetic component is fixedly secured to the second movable waveguide for movement therewith as a unit in response to the presence of a magnetic field.

The magnetic actuator preferably include magnetic means for moving the ferromagnetic component, and thereby moving the second waveguide between the conducting and non-conducting orientations. Preferably, the ferromagnetic component is disposed on an end portion of the other waveguide adjacent the first waveguide, and the unit defines a cantilever which can be electromagnetically flexed to move the second waveguide from one of the orientations to the other of the orientations. The cantilever is preferably U-shaped and undercut. Means may be provided for biasing the second waveguide to a selected one of the orientations.

The present invention also encompasses, in combination, a switch actuator and an array of magnetically-actuatable opto-mechanical on/off switches positioned to form a plurality of light transmission channels. The array is responsive to input light to transmit the same through the channels under the control of the on/off switches in the channels, the output of the array being indicative of the position of the switch actuator relative to the array. The switch actuator comprises the magnetic actuator and is movable relative to the array between a plurality of operative positions for controlling the transmission of light through the switches in the channels, thereby defining the position of the switch actuator relative to the array. Preferably the combination is a monolithically fabricated device, and a switch actuator includes magnetic means for actuating the switches.

In one embodiment of the device, the plurality of switches is disposed in a multichannel array and arranged to form a plurality of binary codes, each of which binary codes is determined by the actuation of various ones of the switches by the switch actuator and thereby uniquely identifies a position of the switch actuator relative to the switches of the array. Each binary code thus indicates the position of the switch actuator along the linear direction of the array. The magnetic means can take the form of a float in a liquid and the entire device can therefore function as a liquid level detector.

In another embodiment of the device, the plurality of switches is disposed in a multichannel array with each channel optically propagating a different spectral component, the on/off state of the various switches being distinguishable on the basis of the spectral components output from the multichannel array, thereby indicating the position of the switch actuator along the linear direction of the multichannel array.

In a further embodiment of the device, the plurality of switches is disposed in a multichannel array, each channel providing a unique delay such that light is output from each channel at a different time. The on/off state of the various switches is distinguishable on the basis of the temporal output from the multichannel array, thereby indicating the position of the switch actuator along the linear direction of the multichannel array.

The array may comprise a liquid level sensor, with the operative position of the switch actuator relative to the array being determined by a liquid level.

BRIEF DESCRIPTION OF THE DRAWING

The above and related objects, features and advantages of the present invention will be more fully understood by reference to the following detailed description of the presently preferred, albeit illustrative, embodiments of the present invention when taken in conjunction with the accompanying drawing wherein.

DETAILED DESCRIPTION OF THE PREFERRED EMBODIMENTS

Figure 1:
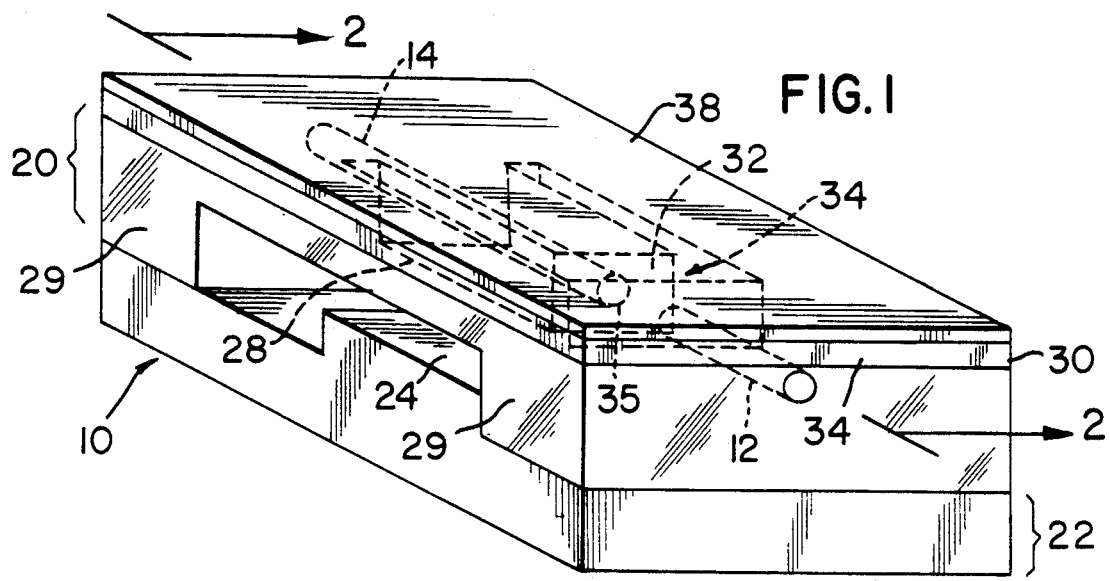
FIG. 1 is an isometric view of a switch according to the present invention.
Figure 2:
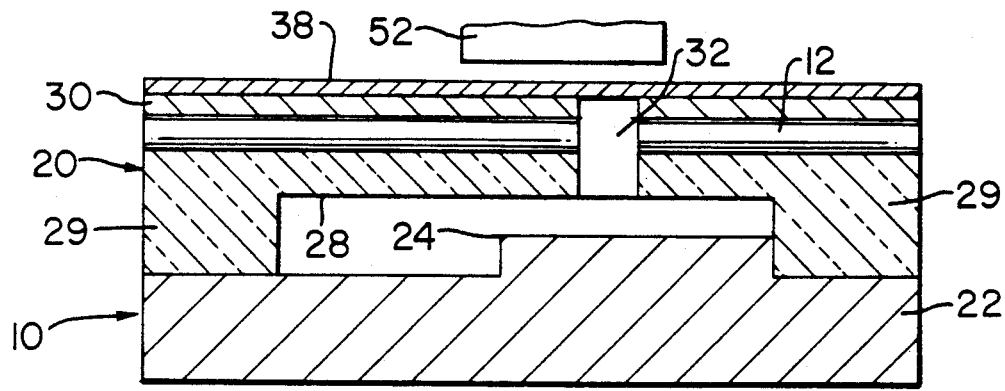
FIG. 2 is a sectional view of the switch in the conducting orientation, including appropriately positioned magnetic means, taken along the lines 2—2 of FIG. 1.
Figure 3:
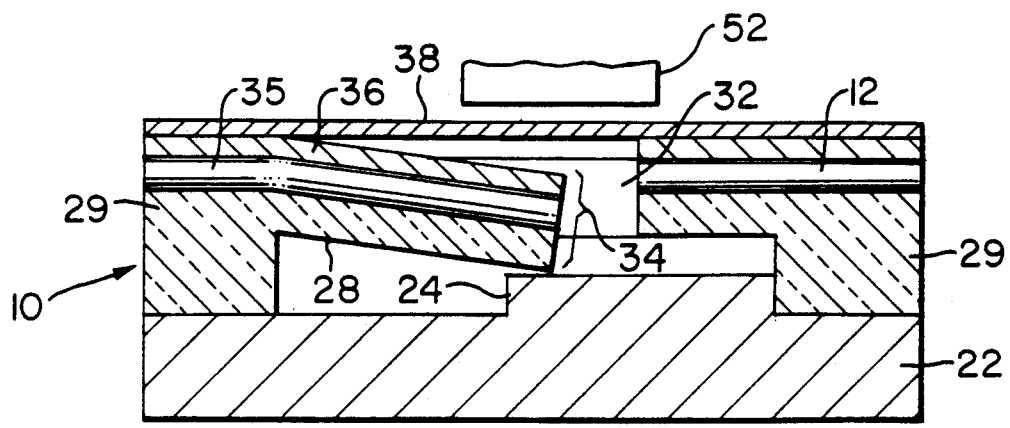
FIG. 3 is a view similar to FIG. 2, but with the switch in the non-conducting orientation.

Referring now to the drawing, and in particular to FIGS. 1–3 thereof, therein illustrated is a monolithically fabricated magnetically-actuatable opto-mechanical on/off switch according to the present invention, generally designated by the reference numeral 10. The switch 10 comprises a pair of planar optical waveguides 12, 14 disposed in an optical waveguide substrate 20 of lower refractive index. One waveguide 12 of the pair is fixed in position, but the other waveguide 14 of the pair is movable between a conducting orientation (illustrated in FIG. 2) wherein it is in optical alignment with the fixed waveguide 12 and a non-conducting orientation (illustrated in FIG. 3) wherein it is not in optical alignment with the fixed waveguide 12.

Typically, a waveguide can be designed in a broad range of dimensions limited by the needs of a given application (e.g., single mode or multimode) and available processing. Currently, 50 to 100 micron ore waveguides are commercially available in planar waveguide configurations. As will be recognized by those skilled in the art, for the purposes of the present invention waveguide structure dimensions can vary from 0.2 mm to 1 mm, as appropriate, to control mechanical properties of the switch such as the amount of movement, the natural frequency, the life, the modulation, etc.

More particularly, the switch 10 comprises a non-flexible waveguide substrate generally designated 20, such as a 3 mm thick glass substrate having a lower index of refraction than the waveguide 12, 14. The waveguide substrate 20 defines a thin intermediate portion 28 disposed intermediate the ends 29 thereof and preferably has the configuration of an inverted U.

For extra rigidity and protection, the waveguide substrate 20 may be disposed on a rigid substrate 22, such as a 1.5 mm thick pane of glass. For reasons which will become apparent hereinafter, the rigid substrate 22 preferably includes a step 24 which functions as a stop.

A layer 30 of ferromagnetic material, such as soft iron, is disposed over the upper surface of the waveguide substrate 20, at least over the intermediate portion 28 thereof. Both the ferromagnetic layer 30 and the intermediate portion 28 of waveguide layer 20 are etched through in a U-shaped pattern 32 in order to define a cantilever generally designated 34. The cantilever 34 is comprised of an end portion 35 of the movable waveguide 14 and a vertically aligned portion 36 of the ferromagnetic layer 30 thereabove, the ferromagnetic potion 36 being fixedly secured to the movable waveguide end portion 35 (adjacent the fixed waveguide 12) for movement therewith as a unit. The free length 35 of movable waveguide 14, the portions of the waveguide 20 above and below the same, and the free length 36 of ferromagnetic material 36 thereabove—all secured for movement as a unit—act as the cantilever 34. The ferromagnetic layer 36 of cantilever 34 responds to magnetic fields by causing the cantilever 34, including the movable waveguide 35, to bend from one orientation to the other.

As illustrated in FIG. 2, in its unactivated state the switch 10 has the movable waveguide 14 in optical alignment with the fixed waveguide 12. If necessary, means 52 may be provided to bias the movable waveguide 14 to this conducting orientation, although the waveguide substrate 20 or ferromagnetic layer 30 may itself perform any requisite biasing. Typically the resiliency of the ferromagnetic layer 30 itself functions as the biasing means for returning the cantilever 30 from its displaced or non-conducting orientation to its normal or conducting orientation. As illustrated in FIG. 3, in its activated state, the switch 10 has the U-shaped and undercut cantilever 34 (including the movable waveguide end portion 35 and moveable ferromagnetic portion 36) depressed to move the movable waveguide 14 into a non-conducting orientation wherein it is not in optical alignment with the fixed waveguide 12.

As noted earlier, preferably a step or ledge 24 of the rigid substrate 22 is disposed at least partially under the cantilever 34 (preferably vertically aligned with the end portion thereof adjacent the fixed waveguide 12) in order to act as a stop and limit the downward movement of the cantilever 34 as it switches from the conducting orientation to the non-conducting orientation. A stop 38, which may simply be a non-flexible layer of glass, plastic or non-ferromagnetic metal (such as aluminum) bonded to the upper surface of ferromagnetic layer 38 outside of the cantilever 34, is preferably also disposed at least partially above the cantilever 34 in order to act as a stop and limit the upward movement of the cantilever 34 as it switches from the non-conducting orientation to the conducting orientation. Thus the stops 24, 38 define the possible extremes of the cantilever 34: stop 38 ensures the optical alignment of the movable waveguide 14 with the facing fixed waveguide 12 for the transmitting or "on" state of the switch 10 in the absence of any magnetic force actuating the switch 10, and stop 24 limits the elastic deformation or mechanical stress of the cantilever 34 by an actuating magnetic force for the non-transmitting or "off" state of the switch 10. Clearly, depending upon the intended application, the conducting or transmitting orientation may be employed as the "off" state of the switch 10 and the non-conducting or non-transmitting orientation may be employed as the "on" state of the switch 10.

Referring now to FIGS. 2 and 3, magnetic means 50 are disposed adjacent the cantilever 34 for moving the ferromagnetic component 36 thereof, and hence the underlying movable waveguide portion 35 thereof, from one orientation to the other. The magnetic means 50 may comprise a permanent magnet or an electrical coil acting as an electromagnet. As the thickness of the waveguide portions 12, 14 is typically quite small, only a minor displacement of the cantilever 34 (for example, about 0.15 mm is required in order to break the optical alignment between the two waveguide portions 12, 14. The magnetic field required to effect a change of orientation will depend upon the magnetic and mechanical properties of the cantilever 34 and particularly the ferromagnetic component 36 thereof and the distance between the magnetic means 50 and the ferromagnetic material 36 of the cantilever 34. Good switch design, such as that illustrated in FIGS. 1-3, permits the magnetic means 50 to be as close as 1 mm to the cantilever 34. In order to provide a threshold level before the switch 10 is actuated, an oppositely directed magnet (not shown) may be used to bias the cantilever 34 to its conducting orientation, with movement of the cantilever 34 from the conducting orientation to the non-conducting orientation occurring only when a larger magnetic force is applied by magnetic means 50 to the switch 10.

The switch 10 can be monolithically fabricated by first depositing a flexible ferromagnetic layer 30 (such as a layer of one of the metals conventionally used in electrical reed switches) on the waveguide substrate 20 at least in the intended area of cantilever 34—for example, by vacuum coating, adhesive bonding of the ferromagnetic layer 30 to the waveguide layer 20, etc. The exposed surface of the ferromagnetic layer 30 is then coated with a photopolymer (not shown), exposed in a pattern, and finally the ferromagnetic metal 30 and the immediately underlying portion of waveguide substrate 20 is etched through to form a U-shaped waveguide slot 32 defining the narrow moveable metal portion 36 of the cantilever 34 and the narrow moveable waveguide substrate portion 35 of the cantilever 34. Then a temporary substrate is used on the etched side for support, while an undercut is made through the waveguide substrate portion 28 from the opposite side. The slot 32 and the undercut leave the narrow movable waveguide portion 35 and metal portion 36 of the cantilever 34 free along its length adjacent one end (that is, the end adjacent the fixed waveguide 12). The magnetic properties of the ferromagnetic portion 36 of the cantilever 34 enable mechanical manipulation of the movable waveguide portion 35 of the cantilever 34 by a magnet.

Figure 4:
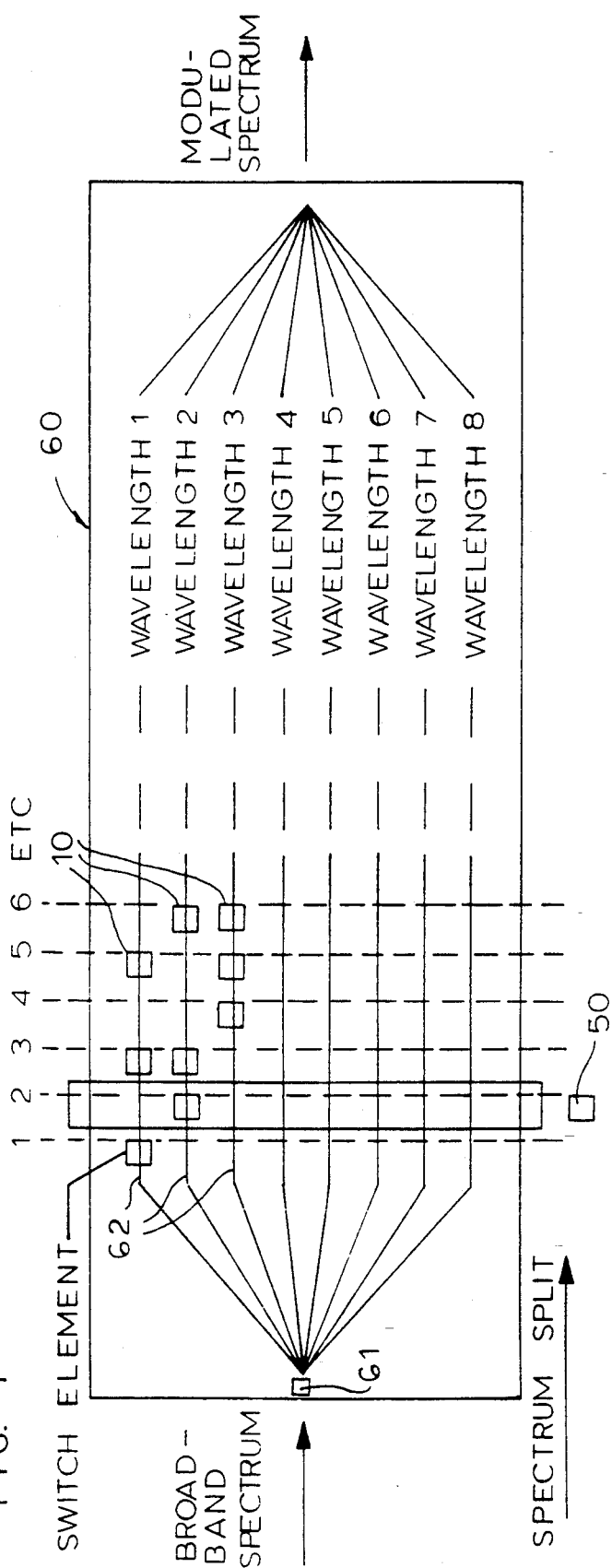
FIG. 4 is a schematic view of a first embodiment of a monolithically fabricated device for sensing the position of a magnetic means.
Figure 7:
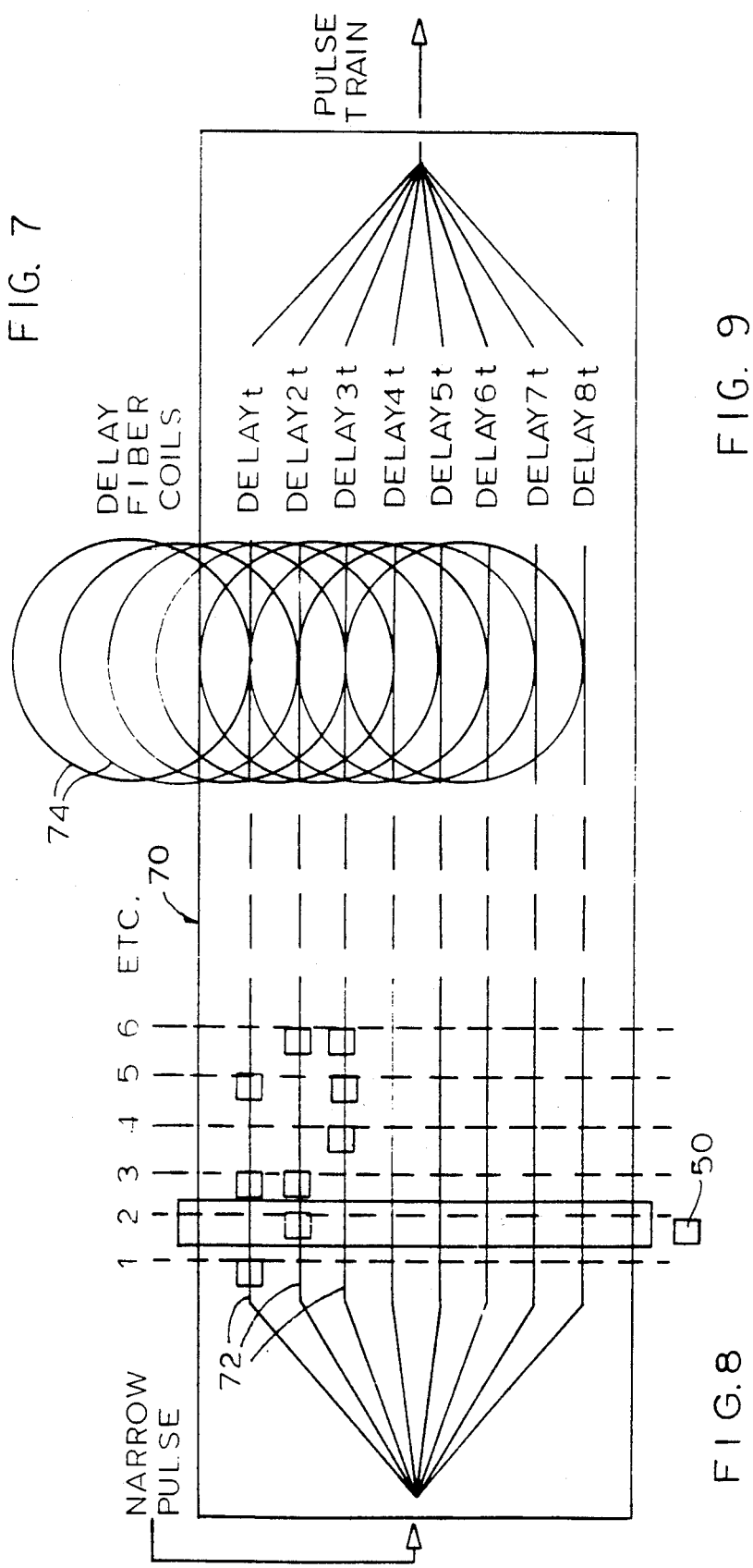
FIG. 7 is a schematic view of a second embodiment of such a device.

Devices, such as those shown in FIGS. 4 and 7, may be inexpensively manufactured (e.g., monolithically fabricated), with each device containing a plurality of switches 10 and optionally a magnetic means 50 for actuating a selected one or more of the switches 10 based upon the position of the magnetic means 50 relative to the switches 10. The devices incorporating a plurality of switches can be utilized, as noted before, in a wide variety of applications. By way of example, and not as a limitation thereon, a few of the preferred applications of the device are described below.

Referring now to FIG. 4, therein illustrated is one embodiment 60 of such a device. A broadband optical source (having the wavelength distribution indicated in FIG. 5) is input to the device 60, which includes conventional means 61 to spectrally split the broadband optical source into a plurality of colors or wavelengths. The device transmits different colors (wavelengths) of the spectrum along a separate optical channel 62, each channel 62 containing at least one switch 10. Depending upon the position of the magnetic means 50 (assuming it is at all times actuated, although in particular instances the magnetic means may or may not be actuated at any given time), one or more of the various switches 10 along a channel 62 of the device 60 are turned off, thus blocking the transmission of light of a respective color. Thus, the output from the device 60 is an output spectrum having certain of the original input wavelengths omitted therefrom (e.g., having the wavelength distribution illustrated in FIG. 6) with the omitted wavelength or wavelengths being indicative of the position of the magnetic means 50. As illustrated in FIG. 4, the magnetic means 50 is at a position No. 2 such that it only precludes transmission of light of wavelength No. 2, this being reflected in the output spectrum which shows the absence of any light of the color responding to the wavelength No. 2. Similarly, if the magnetic means 50 were at position No. 3, the output would be characterized by the absence of light corresponding to both wavelengths Nos. 1 and 2.

Figure 9:
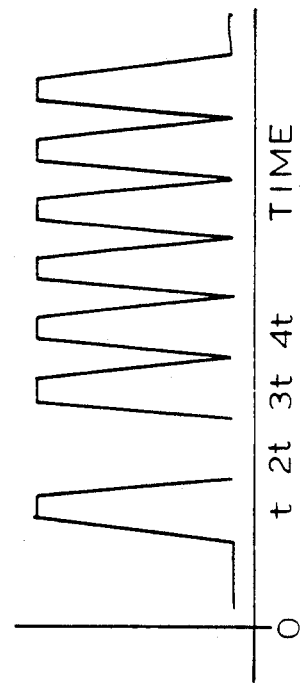
FIGS. 8 and 9 are graphs of the input and output, respectively, for the embodiment of FIG. 7.

Referring now to FIG. 7, therein illustrated is a second embodiment 70 of such a device. A narrow optical pulse (illustrated in FIG. 8) is input to the device 70 at a given instant. The device 70 transmits the pulse along a plurality of optical channels 72, each channel 72 containing at least one switch 10 and having a different effective path length from the other channels 72. The different effective path lengths of the channels 72 may be provided through the use of delay fiber coils 74 of varying lengths, or the like, as conventional in the art. Accordingly, as light travels along the various channels 72 at the same speed, it will take longer for the longer channels 72 to output the light. Thus the single narrow pulse input is divided by the device into a series of distinct and separate pulses successively output over a period of time (as illustrated in FIG. 9). The position of the magnetic means 50 relative to the switches 10 of the device 70 is indicated by the absence of a pulse at a particular delay time t, 2 t, 3 t, etc. As illustrated in FIG. 9, magnetic means 50 is at position No. 2 and thus blocks the flow of the light pulse only along channel No. 2 so that there is no pulse output at the time 2 t. Similarly, if the magnetic means 50 were at position No. 3, the output would be characterized by the absence of a pulse output at delay times t and 2 t.

Figure 6:
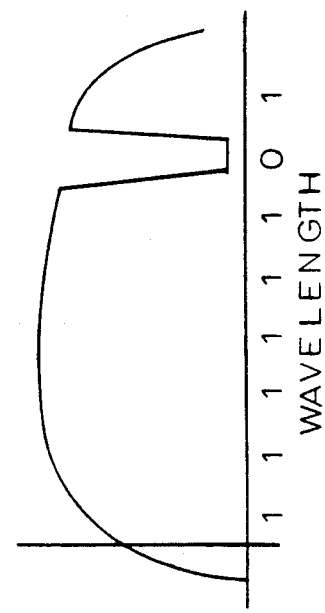
FIGS. 5 and 6 are graphs of the input and output, respectively, for the embodiment of FIG. 4.
Figure 5:
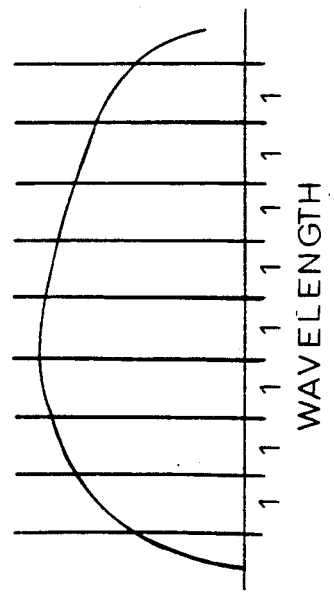
Figure 8:
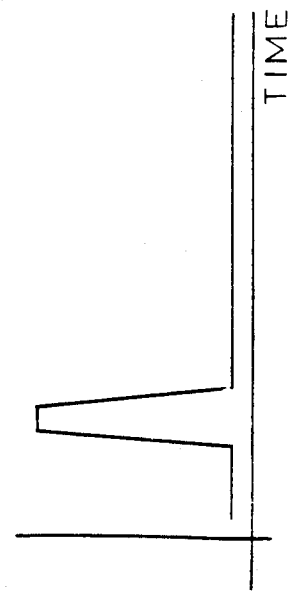

It will be appreciated that the broadband optical input to FIG. 4 (as illustrated in FIG. 5) may be taken as indicating a binary number composed of all 1's, and the output modulated spectrum (as illustrated in FIG. 6) may be taken as a binary number consisting of all 1's except for the 0's which reflect the channels 62 disabled by operation of magnetic means 50 on the switch or switches 10 thereof. Similarly, the narrow pulse input to FIG. 7 (as illustrated in FIG. 8) may be taken as representing a 1 followed by a plurality of 0's and the output pulse train (as illustrated in FIG. 9) may be taken as representing a binary number composed of a series of 1's except for 0's which reflect the channels 72 which have had their switches 10 disabled or turned "off" by operation of the magnetic means 50.

The devices 60, 70 shown in FIGS. 4 and 7 may be advantageously used as a liquid level detector or sensor, with the position of the switch actuator or magnetic means 50 being determined by a liquid level—e.g., by using the magnetic means as a float. In yet further applications, the devices may be utilized as other types of sensors. For example, a modulated (cyclically energized) switch has a fundamental (natural) frequency which will vary with temperature and strain variations. The fundamental frequency variation can be measured to indicate the causative variation in temperature or strain. As the ferromagnetic metal 30 absorbs light well, the switch can be modulated or energized cyclically with light.

In another embodiment of the present invention, a bimetallic coating may be used instead of the ferromagnetic coating 30, and light may be used in place of magnetic means 50. The light (e.g., having the power of a milliwatt) falling on the bimetallic coating of a particular switch will be absorbed and create a thermal difference sufficient to cause movement of the cantilever from one switch orientation to the other. However, thermally activated phenomena generally happen slower than electrical phenomena, so different fundamental frequencies can be expected for light (as compared to electricity) with the same geometry.

To summarize, the invention provides a magnetically-actuatable opto-mechanical on/off switch which is of smaller mass than comparable prior art optical switches (so that switching can be performed with significantly less energy and/or in significantly less time). The present invention further encompasses monolithically fabricated devices containing a plurality of such switches on a single substrate, such switches and devices being economical to manufacture and inexpensive to maintain.

Now that the preferred embodiments of the present invention have been shown and described in detail, various modifications and improvements thereon will become readily apparent to those skilled in the art. Accordingly, the spirit and scope of the present invention is to be construed broadly and limited only by the appended claims, and not by the foregoing disclosure.

I claim:

1. A magnetically-actuatable opto-mechanical on/off switch, comprising:
   (A) first and second monolithically fabricated optical waveguides mounted for relative movement between a first position wherein light is transmittable through said first and second waveguides and a second position wherein light is blocked from transmission through said first and second waveguides; said first waveguide being fixed in position and said second waveguide being movable between a conducting orientation, wherein it is in optical alignment with said first waveguide, and a non-conducting orientation, wherein it is out of optical alignment with said first waveguide; said second waveguide including a ferromagnetic component fixedly secured thereto for movement therewith as a unit in response to the presence of a magnetic field, said ferromagnetic component being disposed on an end portion of said second waveguide adjacent said first waveguide, and said unit defining a U-shaped and undercut cantilever which can be electromagnetically flexed to move said second waveguide from one of said orientations to the other of said orientations; and
   (B) a magnetic actuator for effecting relative movement of said first and second waveguides to control the transmission of light through said switch.

2. The switch of claim 1 additionally including means for biasing said second waveguide to a selected one of said orientations.

3. A device containing a plurality of the switches defined in claim 1, said magnetic actuator being a common magnetic actuator for controlling the transmission of light through each of said plurality of switches.

4. In combination, a switch actuator and an array of magnetically-actuatable opto-mechanical on/off switches positioned to form a plurality of light transmission channels, said array being responsive to input light to transmit the same through said channels under the control of said on/off switches in said channels, the output of said array being indicative of the position of said switch actuator relative to said array;
   each of said switches comprising first and second optical waveguides mounted for relative movement between a first position wherein light is transmittable through said first and second waveguides and a second position wherein light is blocked from transmission through said first and second waveguides; and
   said switch actuator comprising a magnetic actuator for effecting relative movement of said first and second waveguides of at least one of said switches to control the transmission of light therethrough, said switch actuator being movable relative to said array between a plurality of operative positions for controlling the transmission of light through said switches in said channels, thereby defining the position of said switch actuator relative to said array.

5. The combination of claim 4 wherein said channels are arranged to form a plurality of binary codes, each of which binary codes is determined by the actuation of various ones of said switches by said switch actuator, thereby uniquely identifying a position of said switch actuator relative to said switches of said array.

6. The combination of claim 4 wherein each of said channels optically propagates a different spectral component, the on/off state of said switches being distinguishable on the basis of the spectral components output from said array, thereby indicating the position of said switch actuator along a linear direction of said array.

7. The combination of claim 4 wherein each of said channels provides a unique delay such that light is output from each said channel at a different time, the on/off state of said switches being distinguishable on the basis of the temporal output from said array, thereby indicating the position of said switch actuator along a linear direction of said array.

8. The combination of claim 4 wherein said array is monolithically fabricated.

9. The combination of claim 4 wherein said array comprises a liquid level sensor and the operative position of said switch actuator relative to said array is determined by a liquid level.

10. A device containing a plurality of magnetically-actuatable opto-mechanical on/off switches, said device being intended for use with a magnetic switch actuator,
   each said switch comprising a pair of optical waveguides, a first waveguide of said pair being fixed in position and a second waveguide of said pair being movable between a conducting orientation wherein it is in optical alignment with said first waveguide and a non-conducting orientation wherein it is not in optical alignment with said first waveguide; said second waveguide having adjacent said first waveguide a ferromagnetic component fixedly secured thereto for movement therewith as a unit, said unit defining a cantilever which can be electromagnetically flexed by a magnetic switch actuator to move said second waveguide from one of said orientations to the other of said orientations.

11. The device of claim 10 additionally including a magnetic switch actuator means for moving said ferromagnetic component of at least one of said switches, and hence for moving said second waveguide of at least one of said switches between said conducting and non-conducting orientations.

12. The device of claim 10 additionally including means biasing said second waveguide to a selected one of said orientations.

13. The device of claim 10 including actuator means for electromagnetically flexing said cantilever.

14. A magnetically-actuatable opto-mechanical on/off switch, comprising:
(A) first and second optical waveguides mounted for relative movement between a first position wherein light is transmittable through said first and second waveguides and a second position wherein light is blocked from transmission through said first and second waveguides; said first waveguide being fixed in position and said second waveguide being movable between a conducting orientation, wherein it is in optical alignment with said first waveguide, and a non-conducting orientation, wherein it is out of optical alignment with said first waveguide; said second waveguide including a ferromagnetic component fixedly secured thereto for movement therewith as a unit in response to the presence of a magnetic field, said ferromagnetic component being disposed on an end portion of said second waveguide adjacent said first waveguide, and said unit defining a cantilever which can be electromagnetically flexed to move said second waveguide from one of said orientations to the other of said orientations, and
(B) a magnetic actuator for effecting relative movement of said first and second waveguides to control the transmission of light through said switch.

15. The switch of claim 14 wherein said magnetic actuator includes magnetic means for moving said ferromagnetic component, thereby to move said second waveguide between said conducting and non-conducting orientations.

16. The switch of claim 14 additionally including means for biasing said second waveguide to a selected one of said orientations.

17. The switch of claim 14 wherein said first and second waveguides are monolithically fabricated.

18. A device containing a plurality of the switches of claim 14, said magnetic actuator being a common magnetic actuator for controlling the transmission of light through each of said plurality of switches.

* * * * *